(12) United States Patent  
Copley et al.

(10) Patent No.: US 8,680,842 B2  
(45) Date of Patent: Mar. 25, 2014

(54) METHOD FOR MEASUREMENT OF TOTAL HARMONIC DISTORTION

(75) Inventors: Kurt H. Copley, Smyrna, TN (US); Donovan Eugene Wilkerson, Nolensville, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 270 days.

(21) Appl. No.: 12/896,060

(22) Filed: Oct. 1, 2010

(65) Prior Publication Data

US 2012/0081104 A1   Apr. 5, 2012

(51) Int. Cl.
 *G01R 13/14*   (2006.01)

(52) U.S. Cl.
 USPC ............. 324/76.15; 324/132; 324/76.12

(58) Field of Classification Search
 USPC ............................. 324/76.12, 132
 See application file for complete search history.

(56) References Cited

U.S. PATENT DOCUMENTS

| | | | |
|---|---|---|---|
| 5,343,404 A | 8/1994 | Girgis | |
| H2143 H * | 2/2006 | Prockup | 360/31 |
| 7,031,251 B2 * | 4/2006 | Chen et al. | 370/208 |
| 7,952,407 B2 | 5/2011 | Yang | |
| 8,175,669 B2 * | 5/2012 | Kobayashi et al. | 600/336 |
| 2004/0171962 A1 * | 9/2004 | Leveque et al. | 600/547 |
| 2007/0179726 A1 | 8/2007 | Bickel | |
| 2010/0030492 A1 * | 2/2010 | Kar et al. | 702/39 |
| 2010/0109875 A1 * | 5/2010 | Ayon et al. | 340/573.1 |
| 2010/0131243 A1 | 5/2010 | Park et al. | |
| 2010/0195258 A1 | 8/2010 | Yang | |

FOREIGN PATENT DOCUMENTS

WO   WO 2008/000990   1/2008

OTHER PUBLICATIONS

J.L. Naguil, Measurement of the Harmonic Contents of Electric Signals Using FPGA and Switched Capacitor Filters, Aug. 13-15, 2008, Trasmission and Distribution Conference and Exposition: Latin America, 2008 IEEE/PES.*
International Search Report for International Application No. PCT/US2011/054296, 5 pages.
Written Opinion for International Application No. PCT/US2011/054296, 7 pages.
Ozdemir, A. et al., "Low cost mixed-signal microcontroller based power measurement technique", vol. 151, No. 4, Jul. 2, 2004, pp. 253-258.
Sarkar, A. et al., "The Nonuniform Discrete Short Time Fourier Transform—A New Tool for Electrical Power Components' Monitoring", Oct. 12, 2008, pp. 1-8.
Naguil, J. L. et al., "Measurement of the harmonic contents of electric signals using FPGA and switched capacitor filters", Aug. 13, 2008, pp. 1-6.
Joseì Mariì A Maza-Ortega et al., "Reference Current Computation for Active Power Filters by Running DFT Techniques", vol. 25, No. 3., Jul. 1, 2010, pp. 1986-1995.

\* cited by examiner

*Primary Examiner* — Jermele M Hollington
*Assistant Examiner* — Dustin Dickinson

(57) ABSTRACT

A method of measuring the total harmonic distortion in an electrical distribution system. The distribution system is sampled regularly to generate a set of data. The data is filtered using a narrow band filtering algorithm to measure the energy in fundamental and other harmonic frequencies. Due to the filtering, the energy in harmonic frequencies can be measured without interference from broadband noise, which provides an improvement in the measurement of total harmonic distortion at low current or voltage levels. A method is provided to sum the energy in identified frequencies in a multi-pass configuration, such that only a subset of all monitored frequencies are filtered and summed in each pass, with the balance being filtered and measured in subsequent passes. After all subsets are measured, the total harmonic distortion is calculated.

22 Claims, 5 Drawing Sheets

METHOD FOR MEASUREMENT OF TOTAL HARMONIC DISTORTION

FIELD OF THE INVENTION

The present disclosure relates generally to measurement of total harmonic distortion in an electrical distribution system, and, more particularly, to a multi-pass method of estimating the total harmonic distortion in an electrical distribution system using filtered components of the spectrum.

BACKGROUND

The total harmonic distortion (THD) of a signal having a fundamental frequency is the total amount of energy present in specific harmonics of the fundamental frequency relative to the amount of energy in the fundamental frequency. The harmonics of the fundamental frequency are integer multiples of the fundamental frequency. The THD is generally estimated by determining two quantities: the energy in the broadband spectrum and the energy present at the fundamental frequency. When the signal is strong relative to any broadband background noise, this estimation technique is sufficient for some applications. Estimation of the energy in the broadband spectrum may be found by taking a fast Fourier transform (FFT) of a time series set of measurements of the signal of interest and summing the square of each resulting bin in the FFT. That is, the THD is conventionally estimated according to Expression 1.

[Expression 1]

$$THD = ((broadband^2 - H_1^2)^{1/2}/H_1) \times 100\%$$

In Expression 1, $broadband^2$ includes harmonic content, and non-harmonic content (broadband noise). The value of $H_1^2$ is the energy of the signal at the fundamental frequency, also known as the first harmonic. Expression 1 works well to estimate the THD in a signal when the signal is strong relative to background noise, because the dominant contribution to $broadband^2$ is from the harmonic frequencies of the fundamental. In Expression 1 subtracting $H_1^2$ from $broadband^2$ is done to make the numerator an estimation of the energy in the other harmonics of the fundamental frequency, although it undesirably includes the energy from broadband noise as well. At signal levels that are low relative to the broadband background noise (non-harmonic content), Expression 1 provides a poor method for estimating true THD, because a significant contribution to $broadband^2$ is from broadband background noise. At signal levels that are low relative to the broadband background noise, the numerator in the right hand side of Expression 1 is a poor estimate of the energy in the other harmonics of the fundamental frequency, and consequently Expression 1 offers a poor estimate of THD. In an alternating current (AC) electrical circuit with a voltage or current having a fundamental frequency, low current levels may provide a signal that is not large relative to the background broadband noise. It is therefore difficult to accurately measure THD in an AC electrical circuit at low current levels. For example, it is difficult to accurately measure THD in a power meter at current levels below 20% of the meter's nominal current levels. The error in THD increases as the current decreases as the broadband noise typically remains the same.

Measurement of total harmonic distortion (THD) in a power distribution system is desirable as many electrical devices and equipment are sensitive to the harmonic content of supplied current or voltage. Non-linear electrical loads, such as the electronic ballasts used in fluorescent lighting, and electronic components that rely on rectifiers to create a direct current to operate internal circuitry, typically increase the THD in a power distribution system because non-linear loads do not draw current evenly but instead rapidly switch between drawing and not drawing current in order to achieve a direct current rectification. Harmonic content in a power distribution system can also be amplified by the reactance of the power distribution system or from the reactance of components connected to the power distribution system.

High values of THD in a power distribution system can have harmful effects on the distribution system itself and on any electronics connected to it. For example, high values of THD in the current of a power distribution system may lead to excessive current being drawn on the neutral wire. In another example, high values of THD in the voltage of a power distribution system may lead to excessive, and potentially damaging, voltage being applied to components connected to the power distribution system. In a power distribution system incorporating three powered lines with each line having a waveform in current and voltage and with the waveform on each line having a 120 degree phase offset relative to the others, triplen harmonics of the fundamental frequency are of special interest. Triplen harmonics are those that are odd integer multiples of three times the fundamental frequency. In a three line power distribution system the triplen harmonics are of particular interest because the 120 degree phase offset of the three different lines causes the triplen harmonics to be additive. So, for a power distribution system with a fundamental frequency of 60 hertz, the first triplet harmonic is at 180 hertz, and so on. For a power distribution system having a fundamental frequency of 50 hertz, the first triplet harmonic is at 150 hertz, and so on.

Additionally, accurate determination of THD may be of interest in applications other than power distribution systems where analog signals are sought to be monitored. For example, audio systems are designed to meet THD tolerances in order to improve sound quality and potentially decrease feedback.

BRIEF SUMMARY

A method for determining total harmonic distortion (THD) of a signal having a fundamental frequency is provided. In an implementation of the present disclosure, the THD may be determined by measuring a signal to form a set of measurements and then analyzing the set of measurements using a narrow band filtering algorithm applied to the measured signal at frequencies of interest: namely the fundamental and other harmonic frequencies. In a configuration, the narrow band filtering algorithm can be a Goertzel algorithm. The narrow band algorithm chosen can advantageously have a frequency response that is tuned such that the peak of the frequency response is centered on, or contains, a frequency of interest. A narrow band algorithm responsive to each of the frequencies of interest can be applied to the set of measurements in an implementation. A characteristic frequency band defines a range over which the algorithm is most responsive. In an example configuration, the characteristic frequency band of the narrow band filtering algorithm may have a frequency range between 0.5 and 5 hertz.

Further, the frequency response of the narrow band filters can be tuned according to the methods available in the field of digital signal processing. The frequency response of the filtering algorithms can optionally be tuned to achieve desired results given the requirements and capabilities of a particular implementation. For example, the set of measurements can be weighted prior to applying the narrow band filtering algorithm in order to minimize the frequency response of the algorithm in sidebands or to otherwise shape or tune the frequency response of the algorithm.

Analyzing the set of measurements with the narrow band filtering algorithms improves both the efficiency and the accuracy of the determination of THD. By filtering the set of measurements with, for example, Goertzel algorithms, broadband background noise is filtered out and the determination of THD is more accurate than conventional methods when the signal is low relative to broadband background noise. Implementations of the present disclosure use a narrow band filtering algorithm that is a Goertzel algorithms having a frequency response characterized by a 1 hertz frequency band. Analyzing the set of measurements with a Goertzel algorithm allows for a configuration to use less memory than a typical Fast Fourier Transform (FFT). The Goertzel algorithm can be executed iteratively as measurement samples are being taken. On the other hand, an FFT requires a complete set of measurement samples to be stored in memory before commencing the algorithm. The Goertzel algorithm also requires fewer calculations than a typical single frequency Discrete Fourier Transform (DFT) or than a typical FFT. The Goertzel algorithm operates by performing a single multiplication and addition operation for each measurement in the set of measurements and can be applied to the set of measurements as they are taken, thus eliminating the requirement that an entire set of measurements be simultaneously stored in memory. Further, the Goertzel algorithm is not dependent on the number of samples in a set of measurements being a power of 2. While implementations of the present disclosure may be described with reference to application of a Goertzel algorithm, the present disclosure is not so limited and applies to similar methods utilizing any narrow band filtering algorithm, including a DFT.

One or more implementations provide a method of determining THD according to a multi-pass method. In a configuration utilizing a multi-pass method, the magnitudes of a measured signal at a set of identified frequencies are determined in subsets. The THD of a signal is determined at a base rate of, for example, once per second. The magnitudes of the measured signal at each of the identified frequencies can be determined at a rate less than the base rate. For example, in a configuration, the magnitudes of the measured signal at half of the identified frequencies can be determined every other second while the rest of the magnitudes are calculated in the intervening seconds. Because the full set of magnitudes of identified frequencies is determined after multiple passes of the method provided by one or more embodiments of the present invention, the method may be considered a multi-pass method. According to one or more implementations of the present disclosure, the THD of a signal can be determined with less computational capacity than is necessary to compute the content of every identified frequency of interest simultaneously, because only a subset of magnitudes are determined during any one cycle or pass of the method provided.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION

Figure 1:
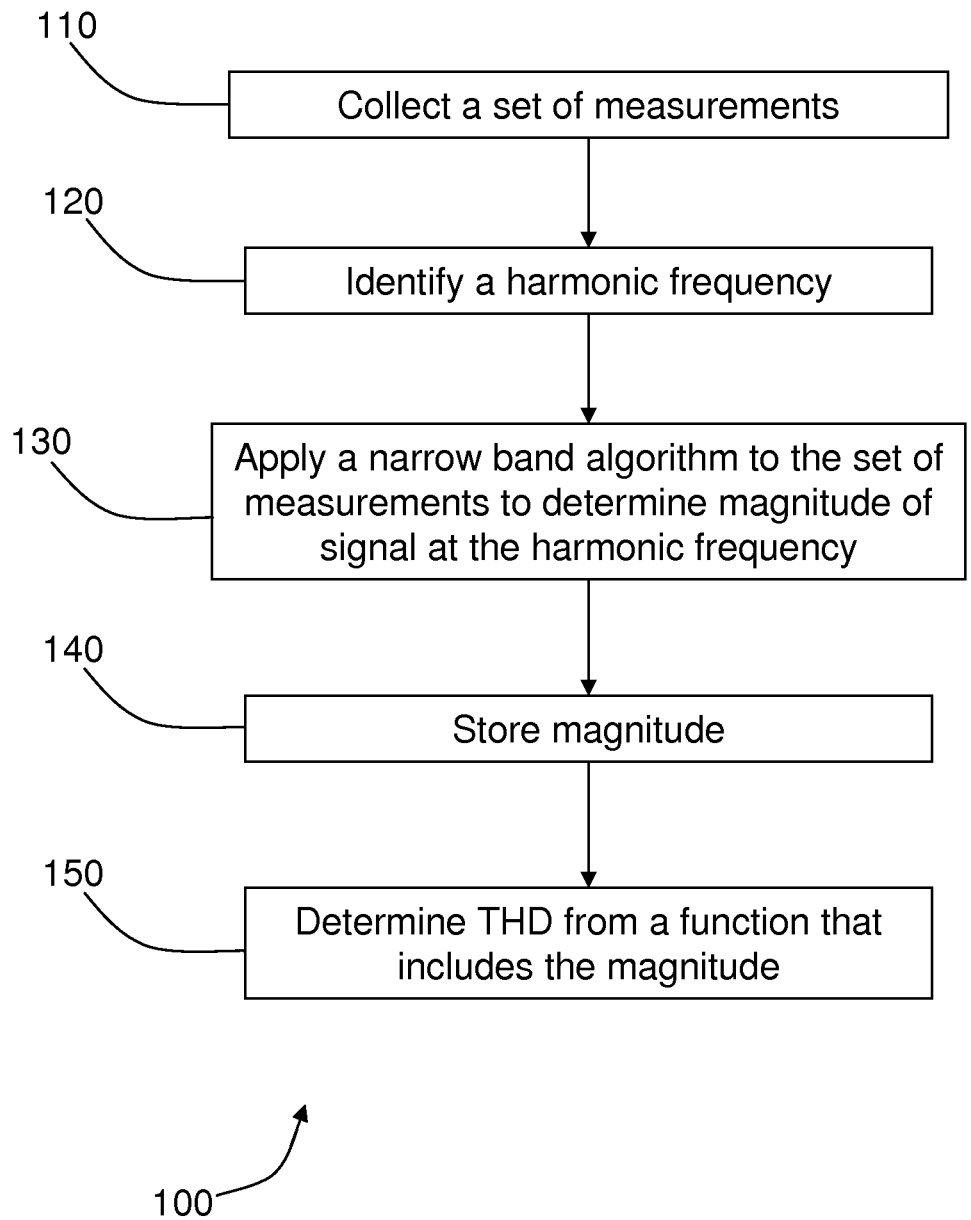
FIG. 1 is an illustration of a flowchart detailing a sequence for determining the total harmonic distortion (THD) of a signal utilizing a filter to determine harmonic content of the signal.

FIG. 1 is an illustration of a flowchart 100 detailing an example sequence for determining the total harmonic distortion (THD) of a current or voltage in an alternating current (AC) electrical circuit. In an embodiment, the method illustrated in the flowchart 100 may be useful, for example, if implemented in a power metering system to monitor the THD of current or of voltage in a power distribution system. Additionally, the method illustrated by the flowchart 100 may be utilized in an instance where the THD of a signal having a fundamental frequency is sought to be determined. The flowchart 100 includes a first block or module 110, a second block 120, a third block 130, a fourth block 140, and a fifth block 150. In the first block 110 a set of measurements is collected from a signal. In the second block 120 a harmonic frequency is identified. In the third block 130 the content of the signal at the identified harmonic frequency is determined through operation of a Goertzel algorithm or other method to filter the collected samples and only examine the content of the signal at the identified harmonic frequency. In the fourth block 140 the magnitude of the signal at the identified harmonic frequency is saved to a memory. In the fifth block 150 the THD is computed according to a function including the saved magnitudes.

In the first block 110 a set of measurements is collected. The measurements collected in the first block 110 may include the current in a line of a power delivery system or the voltage potential between two powered lines in a power delivery system or the voltage potential between a powered line and a neutral line, or other reference line, in a power delivery system. In an example configuration, measurements may be taken at a rate sufficient to enable the examination of a frequency of interest according to the limitations of the Nyquist theorem. For example, measurements can optionally be taken at a rate of 32 samples per cycle of the fundamental frequency such that measurements are taken at a rate of 1920 samples per second when the fundamental frequency is 60 hertz and 1600 samples per second when the fundamental frequency is 50 hertz. Other rates of measurements per cycle of the fundamental frequency can optionally be used in an implementation. The frequency of interest identified in the second block 120 can be an integer multiple of the fundamental frequency or the fundamental frequency of the AC electrical circuit. In an example configuration the fundamental frequency of the AC electrical circuit can be 60 hertz or 50 hertz and the frequency identified in the second block 120 can be an integer multiple of 60 hertz or of 50 hertz.

During the third block 130 the set of measurements is analyzed to determine the content of the signal at the harmonic frequency identified in the second block 120. The third block 130 can be carried out by applying a Goertzel algorithm to the set of measurements. The Goertzel algorithm advantageously enables analyzing the set of measurements without storing the entire set of measurements collected in the first block 110 in a memory simultaneously. Rather, the third block 130 can be carried out by, for example, storing only the most recently measured sample in a memory at any given time. Additionally, a Goertzel algorithm can be used in configurations where computational capacity is limited. The Goertzel algorithm allows for the determination of the content of the measured signal at the identified frequency with fewer computational operations than would be undertaken in a Discrete Fourier Transform (DFT) or in a Fast Fourier Transform (FFT). In an example configuration, the Goertzel algorithm can be implemented by performing one multiplication operation and one or two addition operation on each sample in the set of measurements. The harmonic content of the signal determined in the third block 130 can be the magnitude of the measured signal at the identified frequency, and the identified frequency can be a harmonic frequency of the fundamental frequency.

In the fourth block 140 of the flowchart 100 illustrated in FIG. 1, the magnitude determined in the third block 130 is stored in a memory. In the fifth block 150, the THD is calculated according to a function that includes the magnitude stored in the fourth block 140. The THD can be calculated according to Expression 2:

[Expression 2]

$$THD^2 = ((H_2^2 + H_3^2 + \ldots)/H_1^2)$$

In Expression 2, $H_2$ and $H_3$ are the magnitudes of the measured signal at the second and third identified harmonic frequencies, respectively, and $H_1$ is the magnitude of the measured signal at the fundamental frequency. The ellipsis in Expression 2 indicates that magnitudes of the measured signal at additional identified harmonic frequencies can optionally be included in the numerator in addition to the two which are explicitly included in Expression 2. For example, an estimation of THD can optionally be determined according to Expression 2 using only a single identified harmonic frequency in the numerator. Alternatively, THD can be calculated according to a function described by Expression 2 where $H_1$ in the denominator is the magnitude of the total signal rather than the magnitude of the signal at the fundamental frequency. THD is determined according to Expression 2 by computing a square root of the terms to the right of the equal sign in Expression 2. The accuracy of the determination of THD according to Expression 2 is improved by including only the magnitudes of the measured signal at additional identified harmonic frequencies.

In a configuration, magnitudes of the measured signal at additional harmonic frequencies are determined by repeating the first block 110 through the fourth block 140 of the flowchart 100 while identifying a different harmonic frequency in each repetition of the second block 120 and separately storing the determined magnitude in the fourth block 140 such that the determined magnitudes are available for the determination according to Expression 2 during the fifth block 150. Alternatively, the magnitudes of the measured signal at multiple identified harmonic frequencies can be determined from a single set of measurements according to the flowchart 200 illustrated in FIG. 2.

Figure 2:
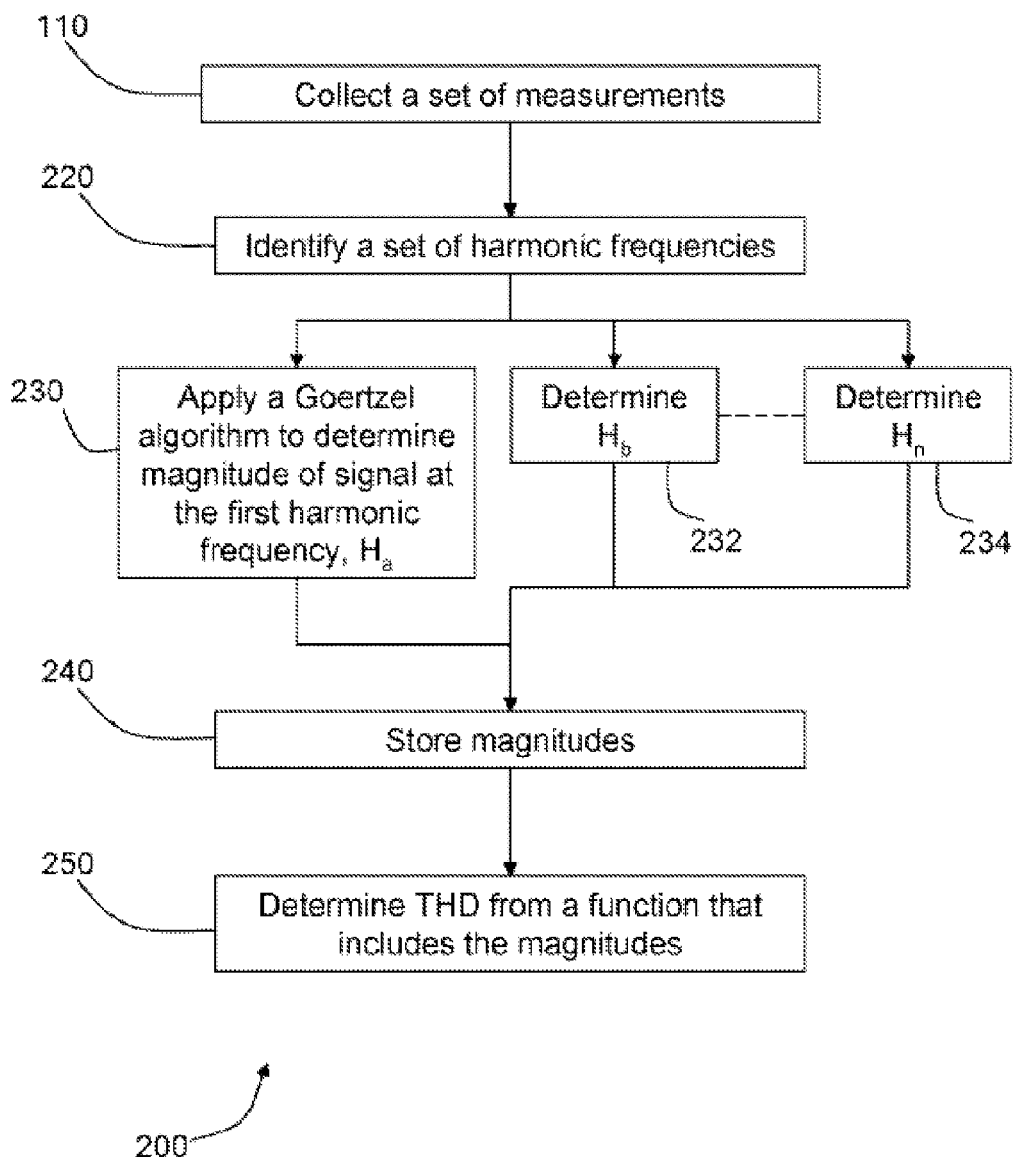
FIG. 2 illustrates a flowchart detailing a sequence for determining THD while calculating the magnitudes of a measured signal at multiple harmonic frequencies from a single set of measurements for each pass.

Turning now to FIG. 2, which illustrates a flowchart 200 detailing an example sequence for determining THD while calculating the magnitudes of a measured signal at multiple harmonic frequencies from a single set of measurements in each pass. The flowchart 200 includes a first block 110 where a set of measurements are collected. The flowchart 200 illustrated in FIG. 2 also includes a second block 220, a first determination 230, a second determination 232, and a last determination 234, a fourth block 240, and a fifth block 250. The second block 220 is similar to the second block 120 from the flowchart 100 illustrated in FIG. 1 except for that in the second block 220 a plurality of harmonic frequencies are identified rather than just one harmonic frequency. The plurality of harmonic frequencies identified in the second block 220 can be considered a set of harmonic frequencies. In a configuration, each of the set of harmonic frequencies identified in the second block 220 can be integer multiples of a fundamental frequency of a voltage or current in an AC electrical circuit being measured in the first block 110.

The flowchart 200 includes a determination of a magnitude of the measured signal at each of the set of harmonic frequencies identified in the second block 220. The determination of magnitudes is illustrated in the flowchart 200 by a first determination 230, a second determination 232, and a last determination 234. In an example, a magnitude of the measured signal is found corresponding to each of the harmonic frequencies identified in the second block 220, and therefore a plurality of magnitudes of the measured signal is determined with each of the plurality of magnitudes corresponding to one of the set of harmonic frequencies identified in the second block 220. The plurality of magnitudes can be considered a set of magnitudes. In the first determination 230, a Goertzel algorithm with a frequency response tuned to the first identified harmonic frequency is applied to the set of measurements and the magnitude of the measured signal at the first identified harmonic frequency is determined. Similar to the third block 130 in the flowchart 100 illustrated in FIG. 1, the frequency response of the Goertzel algorithm, or similar algorithm, can optionally be tuned according to methods available in the field of digital signal processing. The frequency response of the Goertzel algorithm applied to the set of measurements in the first determination 230 can have a characteristic frequency band which includes the first identified harmonic frequency and which defines a frequency range between 0.5 hertz and 5 hertz. For example, the characteristic frequency band of the frequency response of the selected algorithm in the first determination 230 can optionally not exceed 1 hertz.

In a configuration, the set of measurements is filtered to examine only the content of the measured signal at the first identified harmonic frequency when a Goertzel algorithm, or similar narrow band filtering algorithm, with a frequency response tuned to the first identified harmonic frequency is applied to the set of measurements. The second determination 232 and the last determination 234 are similar to the first determination 230 except that in the second determination 232 a magnitude of the measured signal at the second identified harmonic frequency is determined and in the last determination 234 a magnitude of the measured signal at the last identified harmonic frequency in the set of identified harmonic frequencies is determined. The magnitude of the first identified harmonic frequency can be referred to as $H_a$; the magnitude of the second identified harmonic frequency can be referred to as $H_b$; and the magnitude of the last identified harmonic frequency can be referred to as $H_n$ where n is the number of harmonic frequencies identified in the second block 220.

In an implementation, the first determination 230, the second determination 232, and any additional determinations up to the last determination 234 are performed on the same set of measurements collected in the first block 110. For example, in contrast to the flowchart 100 illustrated in FIG. 1, it is not necessary to repeat the collection of measurements in the first block 110 in order to determine the magnitude of the measured signal at multiple identified harmonic frequencies. In a configuration, the flowchart 200 can include the determination of five magnitudes of the measured signal at five identified harmonic frequencies, or of seven magnitudes of the measured signal at seven identified harmonic frequencies.

In the fourth block 240 of the flowchart 200 illustrated in FIG. 2 the magnitudes determined in the third block are stored in a memory. In the fifth block 250, the THD can be calculated according to a function including the magnitudes stored in the fourth block 240. The fifth block 250 can be implemented by calculating THD according to Expression 2 by making the numerator of the right hand side of Expression 2 a summation of the square of each magnitude saved in the fourth block 240. The THD is then found by taking a square root of both sides of Expression 2.

In the third block 130 of the flowchart 100 illustrated in FIG. 1, or in the determination blocks (230, 232, 234) of the flowchart 200 illustrated in FIG. 2, the Goertzel algorithm may be replaced with another suitable narrow band algorithm for examining the content of the signal at the particular identified frequency. For example, a Discrete Fourier Transform (DFT) can be used to compute the magnitude of the measured signal at the harmonic frequency identified in the second block 120. The Goertzel algorithm or other suitable narrow band algorithm used in the third block 130 advantageously has a frequency response that is tuned to the harmonic frequency identified in the second block 120. In an embodiment, the frequency response of the Goertzel algorithm can be described by a peak centered on the harmonic frequency identified in the second block 120. Alternatively, the frequency response of the Goertzel algorithm can be described by a peak that includes the harmonic frequency identified in the second block 120. The peak of the frequency response of the Goertzel algorithm applied in the third block 130 can be described as having a characteristic frequency band defining a range over which the algorithm is most responsive. In an example configuration, for example, the characteristic frequency band of the Goertzel algorithm may have a frequency range of 0.5 hertz to 5 hertz. In a configuration, the characteristic frequency band of the Goertzel algorithm applied in the third block 130 does not exceed 1 hertz. The characteristic frequency band of the narrow band filtering algorithm can be determined in part by the number of measurements collected in the first block 110 and the rate at which measurements are collected in the first block 110. Further, the frequency response of the Goertzel algorithm, or similar algorithm, can be tuned according to methods available in the field of digital signal processing. For example, the set of measurements can be weighted prior to applying the Goertzel algorithm, or similar algorithm, in order to minimize the frequency response of the selected algorithm in sidebands or to otherwise shape or tune the frequency response of the algorithm.

Figure 3:
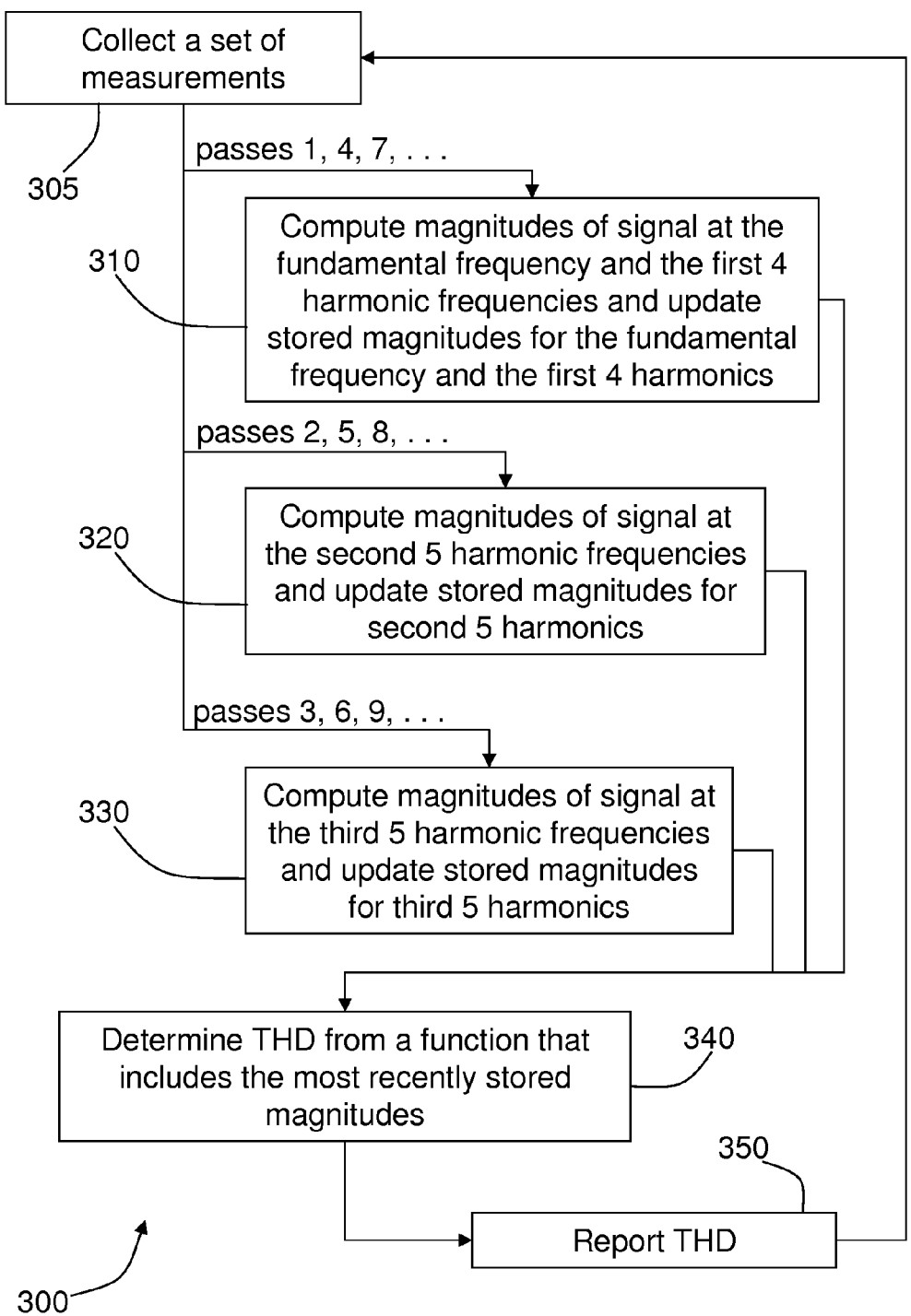
FIG. 3 illustrates a flowchart detailing a sequence for determining and updating THD according to a multi-pass method computing the content of the fundamental frequency and each harmonic frequency of interest after every third update of the total harmonic distortion.
Figure 4:
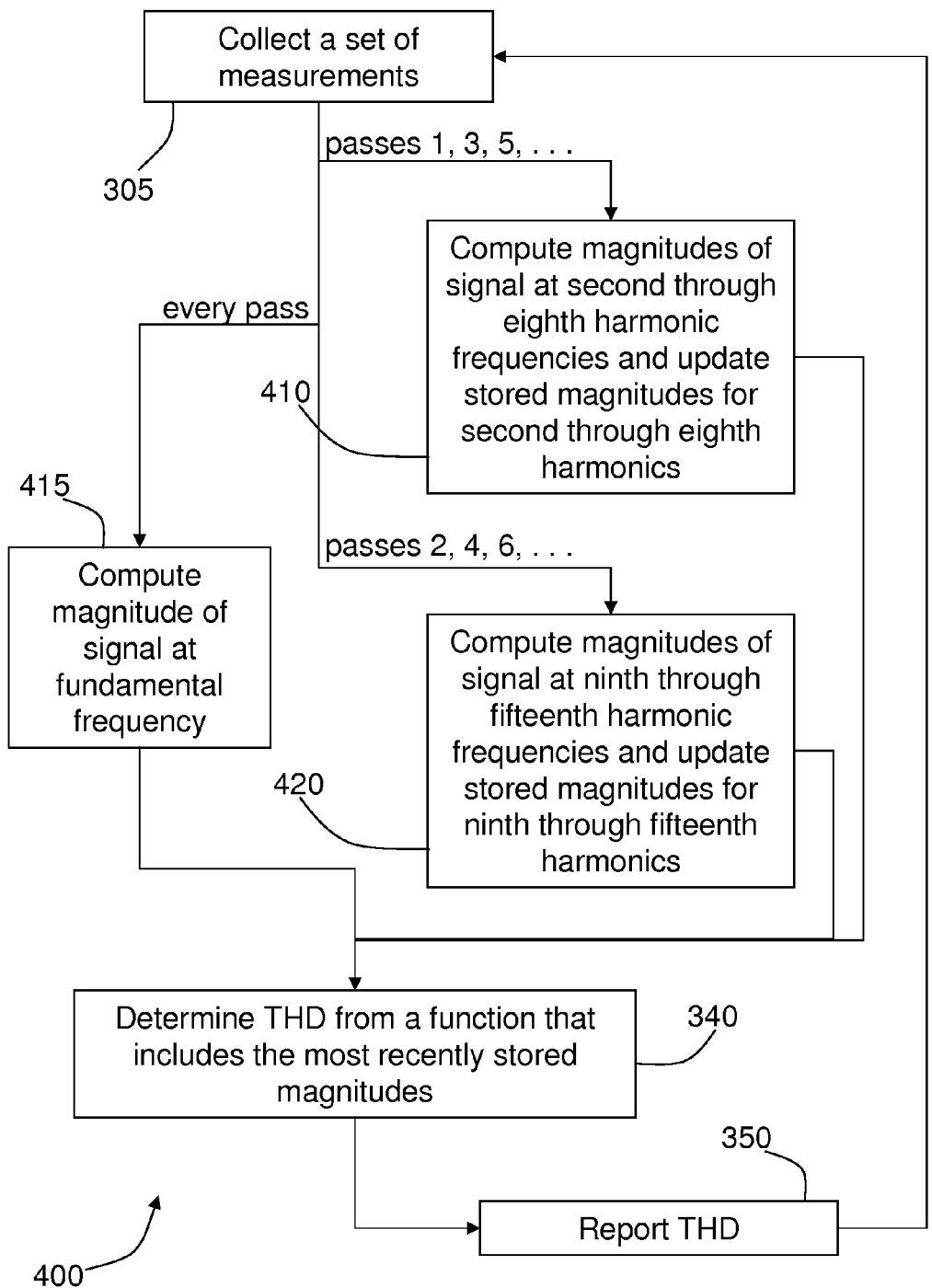
FIG. 4 illustrates a flowchart detailing a sequence for determining and updating THD according to a multi-pass method being zero blind on the fundamental frequency and computing half the harmonics of interest between each update of THD.
Figure 5:
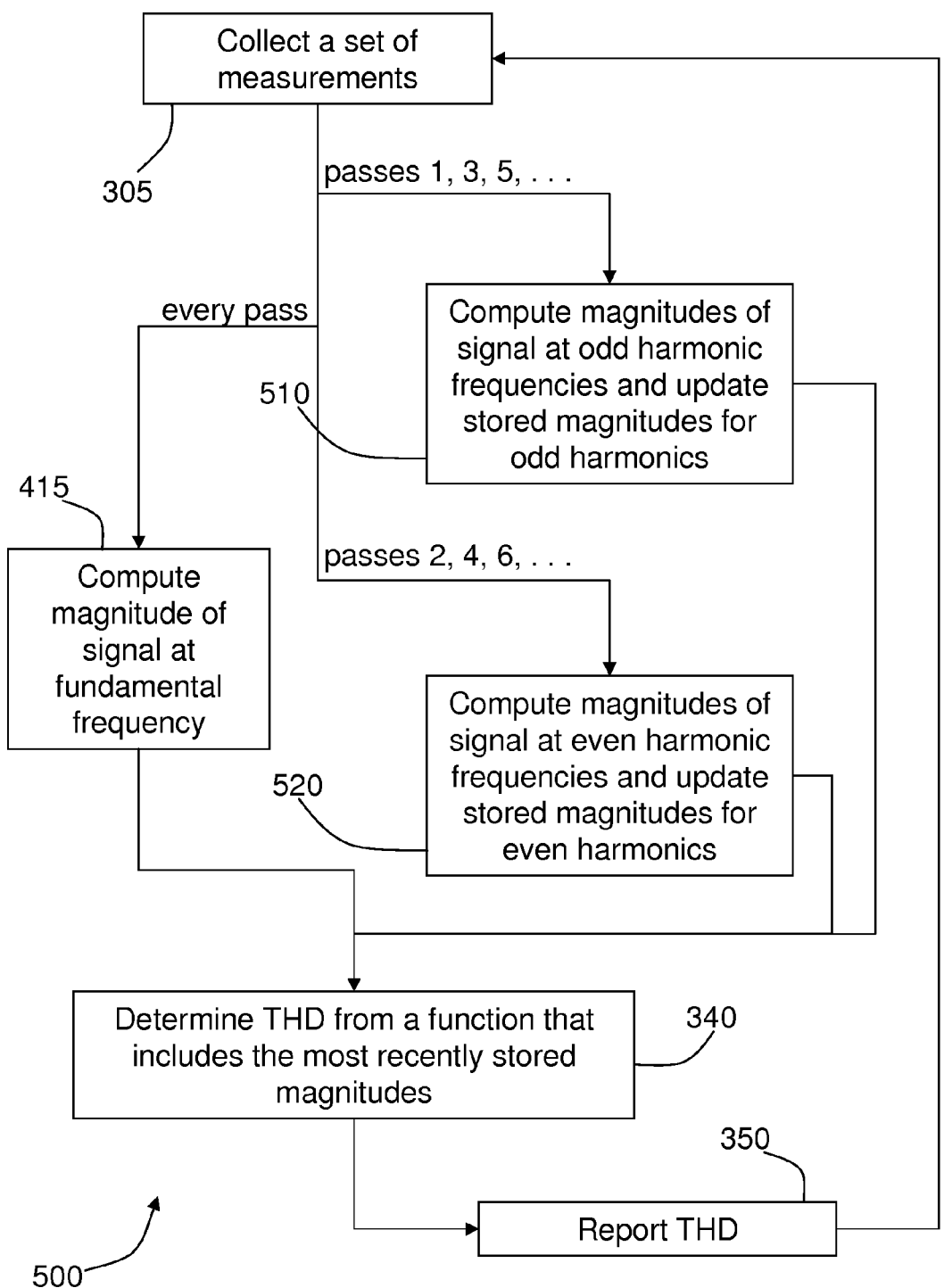
FIG. 5 illustrates a flowchart detailing a sequence for determining and updating THD according to a multi-pass method being zero blind on the fundamental frequency and alternating between the content of odd harmonics and even harmonics.

FIGS. 3, 4, and 5 provide examples of the method illustrated in the flowchart 200 illustrated in FIG. 2 where fifteen harmonic frequencies have been identified, and the fifteen harmonic frequencies are found by multiplying the integers one through fifteen by the fundamental frequency. As discussed above, however, implementations of the present disclosure are not so limited as to only examine fifteen identified harmonic frequencies. Additionally, aspects of the present disclosure can optionally utilize harmonic frequencies that are found by multiplying nonconsecutive integers by the fundamental frequency. FIGS. 3, 4, and 5 also each provide flowcharts (300, 400, 500) illustrating a method of determining the THD of a signal according to a multi-pass method as will be discussed below.

Turning now to FIG. 3, an example flowchart 300 is illustrated, which details a sequence for determining and updating THD according to a multi-pass method computing the content of the fundamental frequency and each harmonic of interest after every third update of THD. The flowchart 300 shown in FIG. 3 includes a measurement block 305, a first pass block 310, a second pass block 320, a third pass block 330, a determination block 340, and an update block 350. In the measurement block 305, similar to the first block 110 of the flowchart 100 illustrated in FIG. 1, a signal is measured to collect a set of measurements. The measurements collected in the measurement block 305 can be of a voltage or current in an alternating current (AC) electrical circuit. The first pass block 310 is similar to a combination of the second block 220, the third block, and the fourth block 240 shown in the flowchart 200 illustrated in FIG. 2. In the first pass block 310, the set of measurements is analyzed to determine the magnitude of the measured signal at the first four identified harmonic frequencies and at the fundamental frequency. The determination of the magnitude of the measured signal at the identified frequencies of interest in the first pass block 310 is implemented similarly to the third block 130 in the flowchart 100 illustrated in FIG. 1.

In operation, the first pass block 310 can be implemented as the set of measurements is collected in the measurement block 305. The first pass block 310 is implemented by applying the Goertzel algorithms with frequency responses corresponding to the fundamental frequency and the first four identified harmonic frequencies to the set of measurements collected in the measurement block 305. The Goertzel algorithms can optionally begin being computed before the entire set of measurements has been collected. The Goertzel algorithm applied in the first pass block 310 can optionally begin being computed with as few as one measurement. While the flowchart 300 illustrates the measurement block 305 occurring prior to the first pass block 310, in a configuration some of the computations carried out in the first pass block 310 can be carried out while the set of measurements is still being collected in the measurement block 305.

The determination block 340 determines a value of THD and is implemented in a manner similar to the fifth block 250 in the flowchart 200 illustrated in FIG. 2. The determination block 340 is carried out by evaluating THD according to Expression 2. In a configuration, the value of THD determined in the determination block 340 following the first pass block 310 is determined based only on the magnitudes of the measured signal at the first four harmonic frequencies and the magnitude of the measured signal at the fundamental frequency. In the report THD block 350, the value of THD calculated in the determination block 340 can optionally be reported to a monitor. For example, in an example configuration where it is desirable to regularly monitor the THD of a power distribution system, the report THD block 350 is implemented by communicating the value of THD determined in the determination block 340.

Following the update block 350, a first pass of the flowchart 300 is completed and a second pass of the flowchart 300 is initiated. The measurement block 305 is repeated to initiate the second pass of the flowchart 300. During the second pass, the magnitudes of the measured signal at the second five identified harmonic frequencies are determined in the second pass block 320. The second pass block 320 is similar to the first pass block 310 except that the magnitude of the measured signal at the second five identified harmonic frequencies is determined rather than the magnitude of the signal at the fundamental frequency and at the first four harmonic frequencies. During the second pass block 320 the set of measurements is analyzed by applying Goertzel algorithms having frequency responses peaked at or near each of the second five identified harmonic frequencies. Once the magnitudes of the measured signal at the second five identified harmonic frequencies are determined and stored in the second pass block 320, the determination block 340 is implemented again. During the second pass of the flowchart 300 the determination block 340 is implemented according to Expression 2 based on the saved magnitudes of the measured signal at the fundamental frequency determined in the first pass block 310 and the stored magnitudes of the measured signal at the first nine harmonics determined in the first pass block 310 and the second pass block 320. The value of THD calculated in the determination block 340 during the second pass is therefore a better estimate of THD than the value of THD calculated in the determination block 340 during the first pass, because during the second pass there are more stored magnitudes to include in the evaluation of Expression 2.

Following the determination block 340 in the second pass, the report THD block 350 reports the most recently calculated value of THD and a third pass is initiated by repeating the measurement block 305 again. During the third pass, the magnitudes of the measured signal at the third five identified harmonic frequencies are determined in the third pass block 330. The third pass block 330 is similar to the second pass block 320 except that the magnitude of the measured signal at the third five identified harmonic frequencies is determined rather than the magnitude of the signal at the second five identified harmonic frequencies. During the third pass block 330 the set of measurements is analyzed by applying Goertzel algorithms having frequency responses peaked at or near each of the third five identified harmonic frequencies. The magnitudes determined in the third pass block 330 are stored in the memory to complete the third pass block 330. Following the third pass block 330 the determination block 340 is carried out again. During the third pass, the determination block 340 calculates a more accurate estimate of THD than was calculated during the first pass or the second pass, because during the third pass there are saved magnitudes of the signal at fourteen different identified harmonic frequencies and at the fundamental frequency, which is more than were available during the first pass or the second pass. The determination block 340 evaluates THD according to Expression 2 using magnitudes that were determined and stored during three different passes of the flowchart 300. During the third pass, for example, the determination block 340 determines THD according to Expression 2 based on the first four magnitudes and the fundamental, which were calculated from the first set of collected measurements and saved during the first pass; the second five magnitudes, which were calculated from the second set of measurements and saved during the second pass; and the third five magnitudes, which were calculated from the third set of measurements and saved during the third pass. Following the determination block 340, the report THD block 350 is completed to complete the third pass.

Following the report THD block 350 to complete the third pass, a fourth pass is initiated by collecting a new set of measurements in the measurement block 305. Following the measurement block 305, the first pass block 310 is carried out again. In an implementation, the first pass block 310 is carried out every third pass beginning with the first, fourth, and seventh passes as indicated in the flowchart 300 by the text above the arrow pointing to the first pass block 310. In an implementation, the magnitude of the measured signal at the fundamental frequency and the magnitudes of the signal at the first four identified harmonic frequencies are stored in the memory during the fourth pass by replacing the magnitudes that were saved in the memory during the first pass. Alternatively, the magnitudes stored during the fourth pass cannot replace the magnitudes saved during the first pass, but merely be stored while leaving the previously stored magnitudes in the memory. During the fourth pass of the flowchart 300, the determination block 340 is then carried out using the most recently stored magnitudes, which includes new magnitudes for the measured signal at the fundamental frequency and at the first four identified harmonic frequencies. Similarly, the second pass block 320 is repeated every third pass beginning with the second, fifth, and eighth passes as indicated by the text above the arrow pointing toward the second pass block 320. The third pass block 330 is repeated every third pass beginning with the third, sixth, and ninth passes as indicated by the text above the arrow pointing toward the third pass block 330.

Calculating THD according to the method illustrated by the flowchart 300 can offer computational benefits when, for example, there is not enough computational capacity to compute the magnitudes of a measured signal for all frequencies of interest during a single pass. In an implementation, the method illustrated by the flowchart 300 in FIG. 3 allows for computing the magnitudes of the measured signal at a subset of the harmonic frequencies of interest during each collection of measurements and thereby allows for THD to be determined and updated at a higher rate than the rate that all magnitudes are determined and updated. The method illustrated by the flowchart 300 may be referred to as a multi-pass method of determining and updating THD, because multiple passes of the flowchart 300 are required to form a determination of THD based on all fifteen of the magnitudes of interest.

FIG. 4 illustrates a flowchart 400 detailing a sequence for determining and updating THD according to a multi-pass method being zero blind on the fundamental frequency and computing half the harmonics of interest between each update of THD. The flowchart 400 offers an illustration of a variation of the multi-pass method for determining and updating THD according to the flowchart 300 illustrated in FIG. 4. The flowchart 400 includes a measurement block 305, a first pass block 410, a second pass block 420, an every pass block 415, a determination block 340, and a report THD block 350. In operation of the method illustrated by the flowchart 400, the measurement block 305 is initiated. The measurement block 305 in the flowchart 400 is similar to the measurement block 305 in the flowchart 300.

Following the measurement block 305, the first pass block 410 and the every pass block 415 are implemented. During the first pass block 410, the magnitudes of the measured signal at a first group of harmonic frequencies are determined by applying Goertzel algorithms to the set of measurements having frequency responses peaked at or near each of the frequencies in the first group of harmonic frequencies. In an example configuration, the first group of harmonic frequencies are frequencies found by multiplying the integers two through eight by the fundamental frequency, and the resulting group of harmonic frequencies may be referred to as the second through eighth harmonic frequencies. Similarly, the magnitudes of the measured signal at the second through eighth harmonic frequencies may be referred to as the second through eighth magnitudes. The first pass block 410 is repeated during subsequent odd passes of the flowchart 400 as indicated by the text above the arrow pointed toward the first pass block 410 on the flowchart 400.

During the second pass block 420, the magnitudes of the measured signal at a second group of harmonic frequencies are determined by applying Goertzel algorithms to the set of measurements having frequency responses peaked at or near each of the frequencies in the second group of harmonic frequencies. In an example configuration, the second group of harmonic frequencies are frequencies found by multiplying the integers nine through fifteen by the fundamental frequency, and the resulting group of harmonic frequencies may be referred to as the ninth through fifteenth harmonic frequencies. Similarly, the magnitudes of the ninth through fifteenth harmonic frequencies may be referred to as the ninth through fifteenth magnitudes. The second pass block 420 is repeated during subsequent even passes of the flowchart 400 as indicated by the text above the arrow pointed toward the second pass block 420 on the flowchart 400.

During the first pass, and subsequent odd numbered passes, of the flow chart 400, the every pass block 415 is implemented simultaneously with the first pass block 410. Similarly, during the second pass, and subsequent even numbered passes, of the flow chart 400, the every pass block 415 is implemented simultaneously with the second pass block 420. The every pass block 415 is carried out by applying a Goertzel algorithm, or other narrow band filtering algorithm, to the set of measurements to determine the magnitude of the measured signal at the fundamental frequency. The algorithm applied to the set of measurements in the every pass block 415 advantageously has a frequency response peaked at or near the fundamental frequency. In a configuration, the method illustrated by the flowchart 400 shown in FIG. 4 allows for determining the magnitude of the measured signal at the fundamental frequency before each determination block 340. Because the magnitude of the measured signal at the fundamental frequency is measured during each pass of the flowchart 400, the method illustrated by the flowchart 400 may be referred to as zero blind with respect to changes in the magnitude of the measured signal at the fundamental frequency.

FIG. 5 illustrates a flowchart 500 detailing a sequence for determining and updating THD according to a multi-pass method being zero blind on the fundamental frequency and alternating between the content of odd harmonics and even harmonics. The flowchart 500 is similar to the flowchart 400 except that the first pass block 410 from the flowchart 400 is replaced with an odd pass block 510 and the second pass block 420 from the flowchart 400 is replaced with an even pass block 520. The odd pass block 510 differs from the first pass block 410 in that the odd pass block 510 is implemented by determining the magnitude of the measured signal at odd harmonic frequencies rather than the second through eighth harmonic frequencies. The odd harmonic frequencies considered in the odd pass block 510 are frequencies found by multiplying an odd integer greater than 1 by the fundamental frequency. For example, where the fundamental frequency is 60 Hertz, the first few odd harmonic frequencies are: 180 Hertz, 300 Hertz, 420 Hertz, 540 Hertz, and so on. Similarly, the even pass block 520 is similar to the second pass block 420 from the flowchart 400 except that the even pass block 520 is implemented by determining the magnitude of the measured signal at even harmonic frequencies rather than the ninth through fifteenth harmonic frequencies. The even harmonic frequencies considered in the even pass block 520 are frequencies found by multiplying an even integer greater than zero by the fundamental frequency. For example, where the fundamental frequency is 60 Hertz, the first few even harmonic frequencies are: 120 Hertz, 240 Hertz, 360 Hertz, 480 Hertz, and so on.

A method is provided to allow for more efficient computation of the total harmonic distortion (THD) in a signal having a fundamental frequency than conventional methods allow. A method is provided to compute the THD of a signal using less computational resources and using less memory resources than conventional methods allow. A method is provided to more accurately compute the THD of a measured signal by determining the content of the signal at identified harmonic frequencies while filtering out broadband background noise. The algorithms and methods disclosed herein can calculate the THD to an accuracy of 0.7% or better in an AC electrical circuit with a signal current as low as 50 milliamps while conventional methods of determining THD generally produce larger errors.

Although the illustrated examples above have been described in connection with a method for monitoring the THD in an AC electrical circuit, aspects of the present disclosure can be applied whenever it is desirable to monitor the harmonic content, and particularly the THD, of a signal having a fundamental frequency.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method for estimating a total harmonic distortion in an alternating current (AC) electrical circuit that receives a current or a voltage having a fundamental frequency, the method comprising:

measuring the current or the voltage received by the AC electrical circuit in samples taken at a predetermined sample rate for each cycle of the fundamental frequency occurring for at least one second to produce a set of measurements;

filtering the set of measurements by determining a magnitude of the measured current or a magnitude of the measured voltage at a harmonic frequency of the measured current or voltage, wherein the harmonic frequency is an integer multiple of the fundamental frequency, wherein the determining is carried out by applying a narrow band algorithm to the set of measurements, the narrow band algorithm having a frequency response that includes the harmonic frequency, wherein the frequency response is characterized by a frequency band that does not exceed one hertz;

calculating the total harmonic distortion according to a function that includes the determined magnitude; and storing the total harmonic distortion in a memory.

2. The method of claim 1, wherein the narrow band algorithm is a discrete Fourier transform, the discrete Fourier transform having a frequency response that includes the harmonic frequency.

3. The method of claim 1, wherein the narrow band algorithm is a Goertzel algorithm having a frequency response that includes the harmonic frequency.

4. The method of claim 3, wherein the frequency response is centered on the harmonic frequency.

5. The method of claim 1, wherein the harmonic frequency is a plurality of harmonic frequencies.

6. The method of claim 1, wherein the measuring the current or the voltage endures for 60 cycles of the fundamental frequency.

7. The method of claim 1, wherein the measuring the current or the voltage endures for 50 cycles of the fundamental frequency.

8. The method of claim 1, further comprising:
measuring the current or the voltage received by the AC electrical circuit to produce a subsequent set of measurements;
filtering the subsequent set of measurements by determining a magnitude of the measured current or a magnitude of the measured voltage at another harmonic frequency of the measured current or voltage, wherein the other harmonic frequency is an integer multiple of the fundamental frequency;
updating the total harmonic distortion according to a function that includes the determined magnitude associated with the other harmonic frequency; and
storing the updated total harmonic distortion in the memory.

9. The method of claim 8, wherein the other harmonic frequency is different from the harmonic frequency.

10. The method of claim 8, wherein the updating the total harmonic distortion is carried out according to a function that includes the determined magnitude associated with the other harmonic frequency.

11. The method of claim 8, wherein the harmonic frequency is a plurality of frequencies, the plurality of frequencies including an odd integer multiple of the fundamental frequency, and wherein the other harmonic frequency is another plurality of frequencies, the other plurality of frequencies including an even integer multiple of the fundamental frequency.

12. The method of claim 1, wherein the filtering includes determining a corresponding magnitude of the measured current or the measured voltage at each of a first set of consecutive harmonic frequencies of the measured current or voltage, such that the function includes the corresponding magnitudes of the first set of consecutive harmonic frequencies.

13. The method of claim 12, further comprising:
further filtering the set of measurements by determining the corresponding magnitude of the measured current or the measured voltage at each of a second set of consecutive harmonic frequencies.

14. The method of claim 1, wherein the filtering includes determining the magnitude of the measured current or the measured voltage at each one of a first fourteen consecutive harmonic frequencies of the measured current or voltage by applying the narrow band algorithm having a frequency response tuned to respective ones of the fourteen harmonic frequencies over a time interval such that the frequency band of the narrow band algorithm does not exceed one hertz.

15. A method for estimating a total harmonic distortion in an alternating current (AC) electrical circuit that receives a current or a voltage having a fundamental frequency, the method comprising:
measuring the current or voltage received by the AC electrical circuit in samples taken at a predetermined sample rate for each cycle of the fundamental frequency occurring for at least one second to produce a first set of measurements;
filtering the first set of measurements by determining a first set of magnitudes of the measured current or a first set of magnitudes of the measured voltage at a first set of harmonic frequencies of the measured current or voltage by applying a Goertzel algorithm to the first set of measurements, the Goertzel algorithm having a frequency response that includes each of the respective harmonic frequencies in the first set of harmonic frequencies and that is characterized by a frequency band that does not exceed 1 Hz;
storing the determined first set of magnitudes in a memory;
measuring the current or voltage received by the AC electrical circuit to produce a second set of measurements;
filtering the second set of measurements by determining a second set of magnitudes of the measured current or a second set of magnitudes of the measured voltage at a second set of harmonic frequencies of the measured current or voltage by applying the Goertzel algorithm to the second set of measurements, the frequency response of the Goertzel algorithm including each of the respective harmonic frequencies in the second set of harmonic frequencies;
storing the determined second set of magnitudes in the memory; and
calculating a total harmonic distortion according to a function including at least some of the magnitudes in the determined first set of magnitudes and the magnitudes in the determined second set of magnitudes.

16. The method of claim 15, wherein the Goertzel algorithm applied to the first set of measurements has a frequency response including one of the frequencies in the first set of harmonic frequencies, and wherein the Goertzel algorithm applied to the second set of measurements has a frequency response including one of the frequencies in the second set of harmonic frequencies.

17. The method of claim 15, wherein the Goertzel algorithm applied to the first set of measurements has a frequency response centered on one of the frequencies in the first set of harmonic frequencies, and wherein the Goertzel algorithm applied to the second set of measurements has a frequency response centered on one of the frequencies in the second set of harmonic frequencies.

18. The method of claim 15, wherein the first set of harmonic frequencies includes odd integer multiples of the fundamental frequency, and wherein the second set of harmonic frequencies includes even integer multiples of the fundamental frequency.

19. The method of claim 15, further comprising:
responsive to the filtering the second set of measurements:
measuring a voltage or a current of the AC electrical circuit to produce a third set of measurements;
filtering the third set of measurements by determining a third set of magnitudes of the measured current or a third set of magnitudes of the measured voltage at a third set of harmonic frequencies;
storing the determined third set of magnitudes in the memory; and
updating the total harmonic distortion by calculating a new value according to a function including at least some of the magnitudes in the determined third set of magnitudes and storing the updated value of total harmonic distortion in the memory.

20. The method of claim 19, wherein the storing the third set of magnitudes is carried out by replacing the first set of magnitudes previously stored in the memory with the third set of magnitudes.

21. The method of claim 19, wherein the third set of harmonic frequencies includes at least one frequency in common with a frequency in the first set of frequencies.

22. The method of claim 19, wherein the third set of harmonic frequencies is the first set of harmonic frequencies.

* * * * *